United States Patent [19]

Fukuda et al.

[11] Patent Number: 4,839,584
[45] Date of Patent: Jun. 13, 1989

[54] SIGNAL LEVEL DISPLAY DEVICE FOR RECORDING/REPRODUCING APPARATUS

[75] Inventors: Nobutoshi Fukuda; Masashi Tanabe; Yoshiki Furuta; Tatsuro Nagao; Naoto Arifuku; Shinichi Yamamisaka, all of Saitama, Japan

[73] Assignee: Pioneer Electronics Corporation, Tokyo, Japan

[21] Appl. No.: 137,912

[22] Filed: Dec. 28, 1987

[30] Foreign Application Priority Data

Dec. 27, 1986 [JP] Japan .............. 61-201196[U]

[51] Int. Cl.⁴ .......................................... G01R 19/16
[52] U.S. Cl. ................... 324/103 P; 324/114; 381/56
[58] Field of Search ........... 324/103 P, 114, 99 R, 324/99 D, 111; 328/151; 307/353; 381/56

[56] References Cited

U.S. PATENT DOCUMENTS 3,421,083  1/1969  Bosworth et al. ............ 324/99 R
3,619,574  11/1971  Mindheim ..................... 324/99 D
4,258,317  3/1981  Dubauskas .................... 324/114

FOREIGN PATENT DOCUMENTS 60-16100  1/1985  Japan .

Primary Examiner—Ernest F. Karlsen
Attorney, Agent, or Firm—Sughrue, Mion, Zinn, Macpeak, and Seas

[57] ABSTRACT

A signal recording/reproducing apparatus having both bar-type and numeric signal-level displaying units which can be easily read. The apparatus includes a sample-and-hold circuit for sampling and holding an input signal at a first predetermined rate, a first display unit for displaying in bar form the sample values sampled by the sample-and-hold circuit, a data holding circuit for sampling and holding the sample values periodically at a second predetermined rate, and a second display unit for numerically displaying the sample values selected by the data holding circuit. The bar code display can change at a rapid rate to dynamically follow the input signal, while the numeric display changes at a slower rate so as to allow the user sufficient time to comprehend the numerically displayed value.

3 Claims, 2 Drawing Sheets ary of the Invention

SIGNAL LEVEL DISPLAY DEVICE FOR RECORDING/REPRODUCING APPARATUS

BACKGROUND OF THE INVENTION

The present invention relates to a signal recording/reproducing apparatus, such as an R-DAT, an 8-mm video tape recorder, a CD player, or the like for recording and/or reproducing a signal such as an audio signal.

When, for example, an audio signal is recorded on a given recording medium, the recording level is monitored to prevent the recording medium from being saturated. Also, during reproduction, the reproduced level must be monitored in order to control the volume of the output sound.

A recent tendency has been to display the signal level with both an analog indicator, such as a bar-type display, and digitally as a numerical value, for example, with the use of a seven-segment display device.

In the conventional apparatus, however, the time period for refreshing the numeric display has been made the same as for the bar-type display. The information displayed by the bar-type display, even if it changes rapidly, can readily be comprehended because of its graphic and pictorial nature. On the other hand, the human observer requires more time to mentally process the numerical value displayed by the seven-segment numeric display. It generally is impossible to comprehend the numeric display if it changes at a rate normal for a bar-type display. Conversely, if the refresh period of the numeric display is slowed to the point where it can readily be comprehended, the bar-type display is overly slow and has a sluggish appearance.

SUMMARY OF THE INVENTION

Accordingly, it is an object of the invention to provide a recording/reproducing apparatus in which the problem noted above has been eliminated and in which both a bar-type display and a numeric display can be easily read.

Satisfying the above and other objects, in accordance with the present invention a recording/reproducing apparatus is provided in which the time interval for refreshing the numeric display is made longer than that for refreshing the bar-type display.

More specifically, in accordance with the present invention, a signal recording/reproducing apparatus is provided comprising a sample-and-hold circuit for sampling and holding an input signal, a first display unit for displaying in bar form a sample value sampled by the sample-and-hold circuit, a data holding circuit for sampling and holding the sample value periodically at a predetermined interval, and a second display unit for numerically displaying the sample value held by the data holding circuit.

In the inventive apparatus, the input signal is sampled and held by the sample-and-hold circuit at a first predetermined timing interval. The sample values thus derived are displayed with bars by the first display unit. These sample values are themselves sampled and held by the data holding circuit periodically at a second predetermined timing longer than the first predetermined timing interval. The values held by the data holding circuit are displayed numerically by the second display unit.

DESCRIPTION OF THE PREFERRED EMBODIMENTS

The present invention will now be explained in further detail with reference to the attached drawings.

Figure 1:
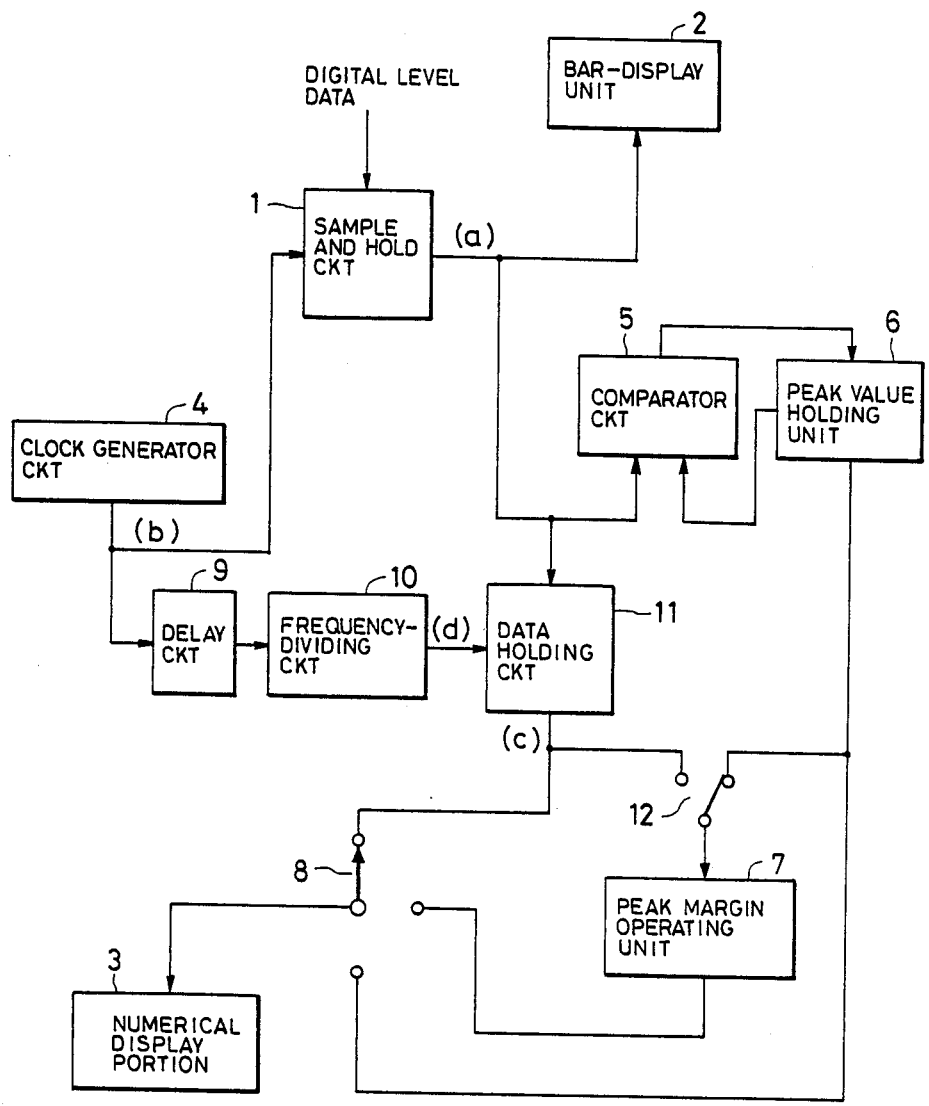
FIG. 1 is a block diagram of a signal recording/reproducing apparatus constructed according to the present invention.

FIG. 1 is a block diagram of a signal recording/reproducing apparatus constructed in accordance with the teachings of the present invention. A sample-and-hold circuit 1 samples and holds an input signal in synchronism with a clock signal generated by a clock generator circuit 4. For example, in an R-DAT, an 8-mm video tape recorder or the like, the input signal applied to the sample-and-hold circuit 1 may be digital level data obtained by digitizing a sample value obtained by sampling an analog audio signal at a predetermined rate, common values of which include 48 KHz, 44.1 KHz and 32 KHz. The frequency of the clock signal (FIG. 3, waveform (b)) supplied from the clock generator circuit 4 is set to be sufficiently lower (for example, lower by several tens of Hz) than the sampling frequency of the analog audio signal. Accordingly, the sample-and-hold circuit 1 periodically samples and hold a predetermined one of the input samples values (FIG. 3, waveform (a)). The sampled value sampled and held by the sample-and-hold circuit 1 is supplied to a bar-type display unit 2 where it is decoded and displayed in bar form.

Figure 2:
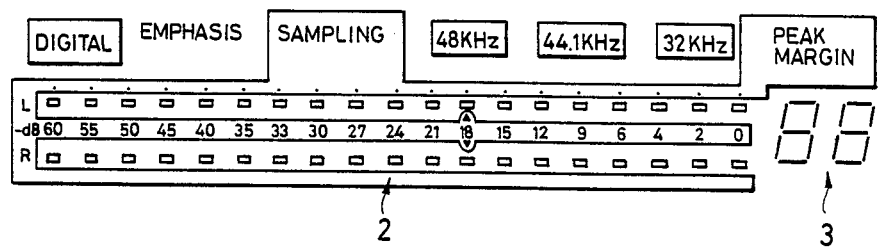
FIG. 2 is a diagram used for explaining the display portions of the apparatus of FIG. 1.
Figure 3A:
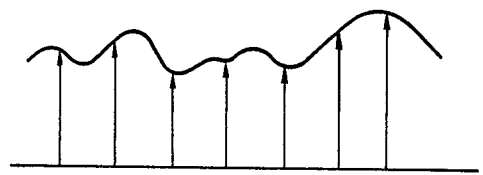
FIGS. 3a–3d are timing charts used to further explain the operation of the inventive apparatus.
Figure 3B:
Figure 3C:
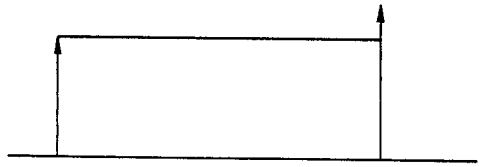
Figure 3D:

On the other hand, the clock signal generated by the clock generator circuit 4 is delayed by a delay circuit 9 for a predetermined delay period, taking the acquisition time into consideration, and then supplied to a frequency divider circuit 10. The delayed clock signal is frequency divided by the frequency divider circuit 10 in a predetermined division ratio and supplied to a data holding circuit 11 (FIG. 3, waveform (d)). The sample value sampled and held by the sample-and-hold circuit 1 is also supplied to the data holding circuit so as to be periodically sampled by the data holding circuit at the timing of the clock signal supplied from the frequency divider circuit 10 (FIG. 3, waveform (c)). The output of the data holding circuit 11 is supplied to a numeric display unit 3 through a switch 8 so as to be decoded and numerically displayed by the numerical display unit 3 (FIG. 2). Accordingly, the time interval for refreshing the numeric display is made longer than the time interval for refreshing the bar-type display. That is, the bar-type display can change rapidly while the numeric display is made to change relatively slowly.

The output of the sample-and-hold circuit 1 is supplied further to a comparator circuit 5 where it is compared with the value presently held by a peak detector circuit 6, and the larger one of the two compared values is stored in the peak value holding circuit 6. Thus, the maximum peak value at that time is held in the peak value holding circuit 6.

Further, a peak margin operating unit 7 is provided to calculate a peak margin of one of the outputs of the data holding circuit 11 and the peak value holding circuit 6 as selected by a switch 8.

The one of the output of the peak holding circuit 6 and the output of the peak margin unit 7 selected by the switch 8 is numerically displayed by the numeric display unit 3. In this case too it should be noted that the peak margin value is also refreshed at the same rate as the output of the data holding circuit 11.

As described above, in accordance with the present invention there is provided a signal recording/reproducing apparatus including the sample-and-hold circuit for sampling and holding the input signal at a first predetermined rate, the first display unit for displaying in bar form the sample values sampled by the sample-and-hold circuit, a data holding circuit for sampling and holding the sample values periodically at a second predetermined rate, a second display unit for numerically displaying the sample values selected by the data holding circuit. In this arrangement, the bar code display can change at a rapid rate to dynamically follow the input signal, while the numeric display changes at a slower rate so as to allow the user to have sufficient time to comprehend the numerically displayed value. As a result, with the invention, both types of display can be easily read.

What is claimed is:

1. A signal recording/reproducing device comprising: a sample-and-hold circuit for sampling and holding an input signal at a first predetermined rate; first display means for displaying in bar form sample values held by said sample-and-hold circuit; a data holding circuit for sampling and holding said values held by said sample-and-hold circuit at a second predetermined rate slower than said first predetermined rate; and second display means for numerically displaying sample values held by said data holding circuit.

2. A signal recording/reproducing device comprising:
   a sample-and hold circuit for sampling and holding an input signal at a first predetermined rate;
   first display means for displaying in bar form sample values held by said sample-and-hold circuit;
   a data holding circuit for sampling and holding values held by said sample-and-hold circuit at a second predetermined rate slower than said first predetermined rate;
   second display means for numerically displaying sample values held by said data holding circuit;
   a comparator circuit receiving on one input said sample values held by said sample-and-hold circuit;
   a peak value holding circuit receiving as an input an output of said comparator circuit, an output of said peak value holding circuit being applied to a second input of said comparator circuit, said comparator circuit and said peak value holding circuit together forming a maximum peak value deriving circuit;
   a peak margin operating unit;
   a first switch for supplying to an input of said peak margin operating unit one of aid output of said peak value holding circuit and an output of said data holding circuit; and
   a second switch for selecting as an input to said numeric display unit one of said output of said data holding unit, an output of said peak margin operating unit, and said output of said peak value holding circuit.

3. A signal recording/reproducing device comprising:
   a sample-and-hold circuit for sampling and holding an input signal at a first predetermined rate;
   first display means for displaying in bar form sample values held by said sample-and-hold circuit;
   a data holding circuit for sampling and holding values held by said sample-and-hold circuit at a second predetermined rate slower than said first predetermined rate;
   second display means for numerically displaying sample values held by said data holding circuit;
   means for supplying clock pulses to said sample-and-hold circuit and said data holding circuit, said clock pulse supplying means comprising a clock generator circuit, an output of aid clock generator circuit being applied as a sampling signal input to said sample-and-hold circuit;
   a delay circuit receiving as an input an output of said clock signal generating circuit; and
   a frequency divider circuit having an input connected to an output of said delay circuit and an output connected to a clock signal input of said data holding circuit.

* * * * *